(12) United States Patent
Faraci et al.

(10) Patent No.: US 6,286,205 B1
(45) Date of Patent: *Sep. 11, 2001

(54) METHOD FOR MAKING CONNECTIONS TO A MICROELECTRONIC DEVICE HAVING BUMP LEADS

(75) Inventors: Anthony B. Faraci, Mountain View; James B. Zaccardi, Sunnyvale; Thomas H. Distefano, Monte Sereno; John W. Smith, Palo Alto, all of CA (US)

(73) Assignee: Tessera, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/209,226

(22) Filed: Dec. 10, 1998

Related U.S. Application Data

(62) Division of application No. 09/079,336, filed on May 14, 1998, now Pat. No. 6,202,297, which is a division of application No. 08/519,828, filed on Aug. 28, 1995, now Pat. No. 5,810,609.

(51) Int. Cl.[7] .................................................. H05K 3/30
(52) U.S. Cl. .......................... 29/837; 29/840; 29/832; 228/180.22; 361/768; 361/774; 361/776
(58) Field of Search ............................. 29/827, 832, 837, 29/838, 840, 593; 361/768, 774, 776; 439/70, 77, 84; 228/116, 180.21, 180.22, 248.1

(56) References Cited

U.S. PATENT DOCUMENTS

| | | |
|---|---|---|
| 3,275,736 | 9/1966 | Hotine et al. . |
| 3,670,409 | 6/1972 | Reimer . |
| 3,818,415 * | 6/1974 | Evans et al. .................... 228/116 |
| 3,823,467 | 7/1974 | Shamash et al. . |
| 3,937,386 | 2/1976 | Hartleroad et al. . |
| 3,998,377 | 12/1976 | Metz . |
| 4,067,104 | 1/1978 | Tracy . |
| 4,189,825 | 2/1980 | Robillard et al. . |
| 4,655,519 | 4/1987 | Evans et al. . |

(List continued on next page.)

FOREIGN PATENT DOCUMENTS

85/02751    6/1985    (WO) .

OTHER PUBLICATIONS

1994 ITAP & Flip Chip Proceedings, "Mechanical Interconnection System for Solder Bump Dice", Hill, et al., pp. 82–86.

Article, Jan. 17, 1994, "Tiny Filter Quashes EMI," *Design News®, Engineering News*.

Article, Aug. 16, 1993 by David Gabel, "Quieting Connectors Down," *Electronic Buyers' News*, Issue 867.

(List continued on next page.)

*Primary Examiner*—Lee Young
*Assistant Examiner*—Rick Kiltae Chang
(74) *Attorney, Agent, or Firm*—Lerner, David, Littenberg, Krumholz & Mentlik, LLP

(57) ABSTRACT

A method for making connections to a microelectronic device having bump leads thereon. A substrate is provided having a front surface and a plurality of electrically conductive posts extending upwardly from the front surface. The posts are disposed in groups, wherein the posts of each group define a gap therebetween. Contacts are provided extending generally horizontally outwardly from each post remote from the front surface of the substrate. The microelectronic device is assembled to the substrate and posts so that the bump leads penetrate into the gaps and engage the contacts which wipe against the bump leads as they are inserted.

30 Claims, 6 Drawing Sheets

U.S. PATENT DOCUMENTS

| | | |
|---|---|---|
| 4,695,870 | 9/1987 | Patraw . |
| 4,716,049 | 12/1987 | Patraw . |
| 4,846,704 | 7/1989 | Ikeya . |
| 4,893,172 | 1/1990 | Matsumoto et al. . |
| 4,902,606 | 2/1990 | Patraw . |
| 4,924,353 | 5/1990 | Patraw . |
| 4,950,173 | 8/1990 | Minemura et al. . |
| 4,950,623 | 8/1990 | Dishon . |
| 4,955,523 | 9/1990 | Calomagno et al. . |
| 4,975,079 | 12/1990 | Beaman et al. . |
| 5,006,792 | 4/1991 | Malhi et al. . |
| 5,067,007 | 11/1991 | Kanji et al. . |
| 5,086,337 | 2/1992 | Noro et al. . |
| 5,130,768 | 7/1992 | Wu et al. . |
| 5,152,695 | 10/1992 | Grabbe et al. . |
| 5,173,055 | 12/1992 | Grabbe . |
| 5,181,859 | 1/1993 | Foreman et al. . |
| 5,196,726 | 3/1993 | Nishiguchi et al. . |
| 5,199,879 | 4/1993 | Kohn et al. . |
| 5,214,308 | 5/1993 | Nishiguchi et al. . |
| 5,228,861 | 7/1993 | Grabbe . |
| 5,311,402 | 5/1994 | Kobayashi et al. . |
| 5,349,495 | 9/1994 | Visel et al. . |
| 5,354,205 | 10/1994 | Feigenbaum et al. . |
| 5,360,347 | 11/1994 | Irlbeck et al. . |
| 5,380,210 | 1/1995 | Grabbe et al. . |
| 5,455,390 | 10/1995 | DiStefano et al. . |
| 5,632,631 | 5/1997 | Fjelstad et al. . |
| 5,802,699 | * 9/1998 | Fjelstad et al. .................... 29/593 |

OTHER PUBLICATIONS

Advertisement, Sep. 8, 1994, TRW Data Technologies, $\mu$Disc EMI Filter Wafer.

Nolan and Bihop, A Tab Tape–Based Chip Test and Burn–In Carrier , 1994 ITAP & Flip Chip Proceedings, pp. 173–179, ©1994 Semiconductor Technology Center, Inc.

"Supplemental Interconnection Devices," *Multichip Modules and Related Technologies*, Ginsburg, et al., pp. 201–229.

"MCM to Printed Wiring Board (Second Level) Connection Technology Options", Alan D. Knight, Multichip Modules & Related Technologies: The Basics (pp.504–509; 521–523).

* cited by examiner

METHOD FOR MAKING CONNECTIONS TO A MICROELECTRONIC DEVICE HAVING BUMP LEADS

This application is a divisional application of application Ser. No. 09/079,336 filed on May 14, 1998, now U.S. Pat. No. 6,202,297, which is a divisional of application Ser. No. 08/519,828 filed on Aug. 28, 1995, now U.S. Pat. No. 5,810,609.

FIELD OF THE INVENTION

The present invention relates to a connector for mounting a microelectronic device having bump leads to a supporting substrate, to a method of making the connector and to a method of making electrical connections between such microelectronic devices and connectors.

BACKGROUND OF THE INVENTION

Microelectronic devices can be electrically joined to other circuitry so as to send and receive information through input/output ("I/O") connectors including numerous individual input/output lines. Until recently, these connectors typically took the form of rows or arrays of conductive pins, generally referred to as pin grid array ("PGA") technology. For some time, microelectronic device manufacturers have been searching for device joining solutions which would allow them to reduce the spacing between adjacent I/O lines. Device manufacturers have also been concerned with enhancing the electrical device characteristics to aid in increasing the overall operation speed, or frequency at which the devices may reliably work. To meet these concerns, manufacturers have moved toward smaller joining solutions, such as perimeter leaded quad flat packs ("QFPs"). Since then joining solutions with even smaller distances or "pitch" between adjacent I/O lines have proved to be necessary. Many manufacturers are now using solder balls arranged in rows or arrays on the bottom side of the devices to interconnect the microelectronic devices to supporting substrates. Typically, this solution is referred to as ball grid array or bump grid array ("BGA") technology.

BGA devices provide a savings in interconnection area for each device. Moreover, greater numbers of BGA devices may be mounted in a given area of a circuit substrate, allowing smaller substrates to be used which in turn tends to minimize signal path lengths between connected devices. This, in turn, reduces signal propagation delays and other detrimental effects such as stray inductance and capacitance.

The proliferation of BGA-type devices has created a need for test sockets which are used to examine the devices prior to shipment to customers. There is a similar need for sockets which can permanently connect BGA devices to supporting substrates. Each bump lead may be entirely comprised of an electrically conductive, heat-actvatable bonding material, such as solder. Alternately, the bump leads may be comprised of a combination of a solid core sphere (typically made of copper or nickel or a combination thereof with a electrically conductive, heat-activatable bonding material around the exterior of the sphere. Further still the bump leads may be plated bumps, typically copper, nickel or gold. The size of a BGA solder ball is typically between about 0.1 mm and about 0.8 mm (5 and 30 mils) in diameter.

One problem encountered in socketing BGA devices is that the bump leads on a single device typically range in diameter width, height and center position. Each BGA socket connector must be able to make a good electrical connection with its respective bump lead while accommodating for these varying factors. Sockets should be also able to accommodate BGA having a distance between adjacent balls of about 1.5 mm or less. The ability to accommodate even smaller pitches, down to about 0.5 mm or less, will become more significant in the near future. These factors, taken together, pose a formidable challenge. In particular, it is difficult to provide for a range of ball diameters in a small contact.

When the device is in operation, another problem that arises is that the device and its supporting substrate typically expand and contract at different rates and at different times, thereby repeatedly stressing the interconnections between them. This can cause the permanently attached bump leads (such as soldered connections) to become unreliable. A BGA socket should also be able to accommodate for these thermal expansion stresses.

A variety of solutions have been put forth to deal with the aforementioned problems. U.S. Pat. Nos. 5,196,726 and 6,214,308 both issued to Nishiguchi et al. disclose a BGA type approach in which bump leads on the face of the chip are received in cup-like sockets on the substrate and bonded therein by a low-melting point material. U.S. Pat. No. 4,975,079 issued to Beaman et al. discloses a test socket for chips in which dome-shaped contacts on the test substrate are disposed within conical guides. The chip is forced against the substrate so that the solder balls enter the conical guides and engage the dome-shaped pins on the substrate. Enough force is applied so that the dome-shaped pins actually deform the solder balls of the chip. Hill et al., Mechanical Interconnection System For Solder Bump Dice, 1994 ITAP And Flip Chip Proceedings PP. 82–86, discloses a test socket for flip chip devices with solder bumps. The socket has rough, dendritic structures on contact pads; here again, the chip with the solder bumps thereon is forced into the engagement with the rough, dendritic structures so as to make temporary contact for testing.

A further example of a BGA socket may be found in U.S. patent application Ser. No. 08/254,991 filed Jun. 7, 1994, commonly assigned to the assignee of the present invention, which deals effectively, but specifically differently, with the problems associated with socketing a BGA device. The '991 application discloses a sheet-like connector having a plurality of holes. Each hole is provided with at least one resilient laminar contact extending inwardly over a hole. The bump leads of a BGA device may then be advanced into the holes so that the bump leads are engaged with the contacts. The assembly can be tested, and if found acceptable, the bump leads can be permanently bonded to the contacts.

Other examples of connector solutions include U.S. Pat. No. 5,380,210 issued to Grabbe et al. discloses an area array connector having leaf spring-like deformable contacts which are disposed within individual module bodies. The module bodies are then placed within an array of openings in a module holder so that the spring contacts may be compressibly placed between and wipe against the opposing conductive pads of a device and a supporting substrate. U.S. Pat. No. 5,360,347 issued to Irlbeck discloses a compressible connector array assembly employing a plurality of individual connectors bonded together and arranged within a frame. U.S. Pat. Nos. 5,152,695, 5,173,055, and 5,228,861 all issued to Grabbe disclose alternate area array connection systems using deformable contacts. U.S. Pat. No. 5,006,792 issued to Malhi et al discloses a test socket in which a substrate has an exterior ring-like structure and numerous cantilever beams protruding inwardly from the ring-like structure. Contacts are disposed on these cantilever beams so that the same can be resiliently engaged with contacts of a chip when the chip is placed in the socket.

Despite all of these efforts in the art, still further improvements would be desirable.

SUMMARY OF THE INVENTION

The present invention provides a connector for a microelectronic device having bumped leads. Typically, each bump lead is received into a respective post group on the front surface of the connector and engages the contacts extending from each of the posts. As the bump leads are inserted within the post groups, the contacts typically engage their respective bump lead at a locus of points of increasing distance from a central axis of the associated post group.

More specifically, one aspect of the present invention provides a connector and associated method of using the connector. The connector includes a substrate and an array of posts extending upwardly from the substrate. Bottom ends of the posts are secured to a front surface of a substrate. The substrate is typically comprised of a rigid material such as ceramic. The posts are disposed in post groups, the posts of each such group defining a gap therebetween. A conductive contact is secured to the top of each post The contacts on the posts in each group extend generally toward the gap defined by the post group. Preferably, the contacts engage the inserted bump lead such that the locus of engagement points increases in distance from a central axis of the post group as the bump lead is inserted therein, and thus will tend to bend each contact so that cradles the inserted bump lead. Typically, this action also bends each contact in a horizontal direction about the axis of the post, placing the post under a torsional force. Such bending can accommodate substantial ranges of bump diameters.

In one embodiment, each of the post groups include two opposing posts defining an interpost axis extending between the posts and across the gap. Each contact has a proximal portion, extending from a post and sloping away from the axis of the group, and a distal portion, sloping toward the interpost axis of the group. The contacts may curve and intertwine between the opposing posts so that each distal portion is disposed between the proximate and distal portions of the contact attached to the opposite post in the same group. Each contact may also be configured in a progressively diminishing spiral. As further discussed below, these features help the contacts to "cradle" an inserted bump lead in a spring-like manner Typically, the contacts of a post group will further have a means to scrape against the bump lead inserted into the gap therebetween. In one embodiment, this means for scraping takes the form of teeth-like or scalloped portions positioned on an interior edge of each contact, facing the gap defined by the posts in one post group. In another embodiment, the means for scraping includes asperities on either the interior edges of the contacts or on a top surface of each contact facing away from the first surface of the substrate.

At least some of the contacts are further typically connected to electrical circuitry through terminals on the supporting substrate or through conductive paths to circuitry on the same substrate. If terminals are used, the terminals are generally arranged in an array on a second surface of the substrate. Each terminal may be electrically connected to at least one post within a respective post group typically through a conductive via extending from the first to the second surface of the substrate. A conductive pad may further be disposed between the post bottoms and the first surface of the supporting substrate so as to electrically interconnect the posts in each common post group. In a preferred arrangement, the terminals are comprised of elongated pins which are placed in alignment with respective conductive vias. The pins can then be disposed within a pin socket on a circuitized support. In another embodiment, the post groups may be electrically connected to circuitry on the same substrate. Desirably, this would be accomplished using a multi-layer substrate in which at least one contact in each post group is connected to a conductive path within the substrate through a conductive via. The conductive paths then run to a different area of the substrate and are connected to circuitry through respective conductive vias.

The post groups may be positioned on the substrate so as to maximize the area for the gaps between each of the post groups while at the same time providing the post groups at a fine pitch. For example, in the embodiment where there are a first and a second post on opposite sides of the gap in a post group, the groups may define a rectilinear grid pattern so that the gaps defined by the post groups are disposed in mutually orthogonal rows and columns, an interpost axes of the post groups being oblique to the rows at an angle θ. The angle θ typically is about 30° to about 70° to most efficiently situate the post groups. Further, the distances between adjacent posts of neighboring groups may be smaller than the distances between the posts in each group so as to widen the associated gap while minimizing the amount of unused space around each post group. Moreover, each post may be of non-circular cross-sectional shape, so that the dimension from the central axis of the post to the periphery of the post is smaller in the direction towards the gap defined by the post group than in other directions. This allows a large gap in a given amount of space thus facilitating the insertion of each of the bump leads within the post groups. Where each post group includes three or more posts, similar factors are balanced to maximize the gap for each post group while maintaining the needed pitch and arrangement to mate with a particular microelectronic device.

Another aspect of the invention includes a method for fabricating connectors, such as the aforementioned connectors for a microelectronic device having bump leads. The method includes first providing a conductive sheet having a front and a back surface and a plurality of conductive posts extending downwardly from the back surface towards a substrate spaced apart from the back surface. Preferably, the substrate is a dielectric. Each post has a bottom end secured to the substrate. The posts further typically are disposed in an array of post groups, each post group including a plurality of posts defining a gap therebetween. The conductive sheet is then selectively etched to form contacts extending laterally from the tops of the posts of each post group toward the gap defined by such group such that the contacts may resiliently engage the bump leads of a microelectronic device. In one embodiment, an etch resistant, conductive layer, such as a gold layer, is used to define the shapes of the contacts prior to etching the conductive sheet. This conductive layer is preferably also used to inhibit oxidation of the conductive sheet material thereunder.

The posts may also be comprised of several different conductive metals. In one embodiment, a first metal, such as nickel, is plated on to the back surface of the conductive sheet and a gold layer is next plated on the nickel. A tin layer is plated on the gold layer so that the tin defines the bottom ends of each of the posts. The conductive sheet is then laminated to the substrate so that each of the post bottoms within each post group are bonded to a conductive pad, typically comprised of gold and attached to the front surface of the substrate creating a gold-tin eutectic bond between the posts and the pads. In another embodiment, conventional lead/tin solder may be applied to the bottom of the nickel layer and used to attach the post to the front surface of the substrate.

The contacts may also be provided with teeth-like or scalloped portions on an interior edge which faces the gap of the associated post group. Asperities on the interior edge or on the top surface of the contacts, facing away from the supporting substrate, may also be provided. Such teeth-like portions and asperities are typically photo-lithographically formed during the selective etching process. The function of the teeth-like portions and the asperities is to engage and scrape against the bump leads as they are inserted into the gaps in respective post groups.

The foregoing and other objects, features and advantages of the present invention will be more readily apparent from the detailed description of the preferred embodiments set forth below, taken in conjunction with the accompanying drawings.

DETAILED DESCRIPTION OF A PREFERRED EMBODIMENT

Figure 1:
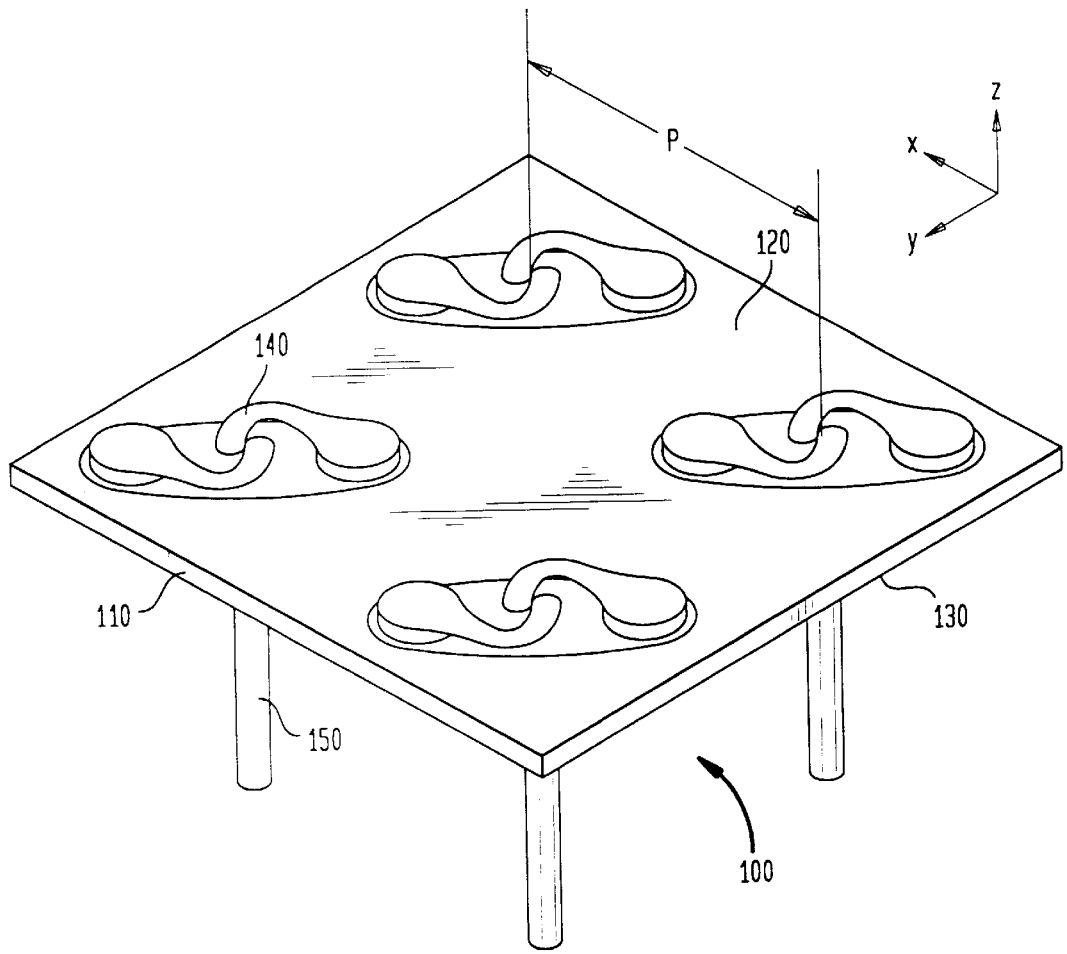
FIG. 1 is a perspective view of a connector according to one embodiment of the present invention.

A mounting assembly 100 according to one embodiment of the invention includes a supporting substrate 110 having a front or top surface 120 with a plurality of sockets 140 disposed thereon. The supporting substrate 110 further has an oppositely facing back or bottom surface 130 with a plurality of terminals 150 disposed thereon and projecting therefrom. Terminals 150 may be conductive pins commonly used in the semiconductor packaging industry. Substrate 110 has a connection means to make an electrical connection from the sockets 140 to the terminals 150. In the example shown in FIG. 1, the connection means includes a plurality of conductive vias (not shown) extending from the front surface 120 to the back surface 130 of the supporting substrate 110. In the example shown in FIG. 2A, the vias 160 typically would be blind vias which would not extend to surface 130. The sockets 140 and terminals/conductive paths (150/150' in FIGS. 1 and 2A respectively) may be aligned with the conductive vias 160 as illustrated, or one or both may be offset from the vias 160 and electrically connected thereto by leads on a surface of or within the substrate 110.

Each socket 140 includes a pair of posts 170 and 180. The posts are attached to and extend from the front surface 120 of the supporting substrate 110. The posts are disposed in post groups, each including a first post 170 and a second post 180, each such group defining the outer boundaries of one socket 140. The posts 170 and 180 of each group further define a gap 210 therebetween. A conductive contact 190 is secured to and in electrical contact with the top of the first post 170 in each group, and further extends generally toward the gap 210 defined by the post group. Similarly, a conductive contact 200 is secured to the top of the second post 180 in each group, and extends toward the center of the gap 210 defined by such post group. At least one of the posts 170/180 in each group is electrically connected to the conductive via 160, and thus connected to the terminal 150. In this embodiment, the bottom ends of both posts are attached to a conductive pad 220 which sits atop first surface 120 and is electrically connected to the conductive via 160. Posts 170 and 180 are comprised of at least one conductive metal, such as nickel or copper. The posts should be comprised of a conductive material which has strength such that the post can withstand both the attachment of the bottom end 230 of each post to the front surface 120 of the supporting substrate 110 and the insertion, engagement and possible misalignment of a bump lead, which are described in more detail below. The bottom end 230 of each post is secured to the front surface 120 of the substrate 110 by bonding the bottom ends of the posts to the conductive pads 220. The conductive pads desirably include gold, and each post includes a material such as tin, silicon or germanium adopted to form an eutectic bond with the gold. Other bonding techniques, such as soldering or brazing, may also be employed.

The substrate 110 is comprised of a rigid dielectric material, such as ceramic or a relatively thick reinforced or unreinforced polymer. Substrate 110 may include internal ground planes, conductors or other features (FIG. 2A) of the type commonly used in circuit boards. Top and back surfaces 120/130 are substantially planar. Directions parallel to the planes of surfaces 120 and 130 are referred to as "Y" and "Y" directions or "horizontal" directions, whereas directions perpendicular to such planes are referred to as "z" or "vertical" directions. Typically, the substrate will be substantially rigid to provide a stable support so that an engagement force may be placed on the back of the microelectronic device in the z-direction such that the force may be evenly distributed to each bump lead. Other elements may be added or taken into account if the bumps leads vary significantly in height.

Figure 2A:
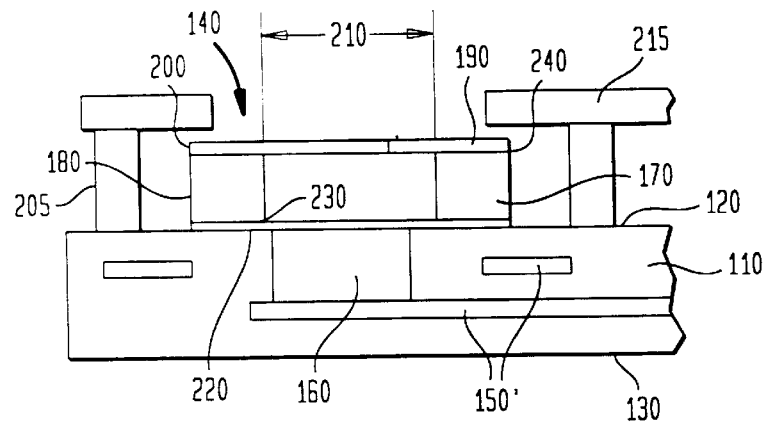
FIG. 2A is a side elevational view of an individual socket according to another embodiment of the present invention.

The connection means 160 may be made in any suitable method to provide an adequate conductive path between the sockets 140 and the terminals 150, in FIG. 1, or other circuitry on the substrate 110 through conductive paths 150', shown in FIG. 2A. Preferably, conductive vias 160 are made by mechanically drilling, chemically etching, or laser drilling holes in the supporting substrate 110 and metallizing the interior walls of the holes by selectively electroplating a conductive metal, such as copper or gold, thereto. The holes may be hollow or may be plated until they are completely plugged with the conductive metal. If the holes are hollow, a conductive metal such as solder may be disposed therein by standard techniques. Any other method of forming a through-conductor in a dielectric structure can also be used for coupling the sockets to the terminals.

Figure 2B:
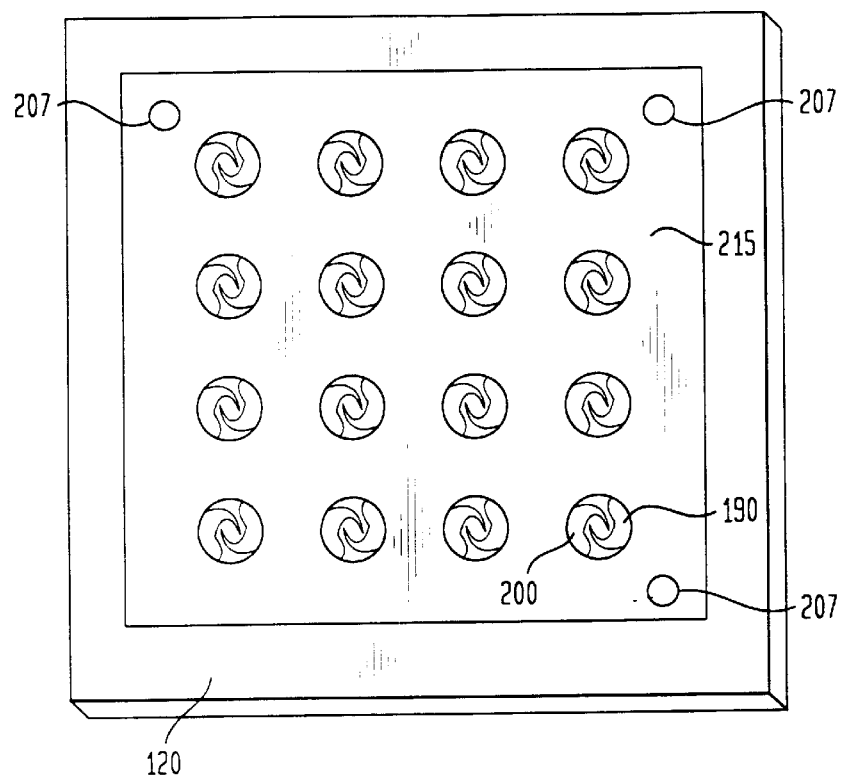
FIG. 2B shows a top view of the connector according to another embodiment of the present invention.
Figure 2C:
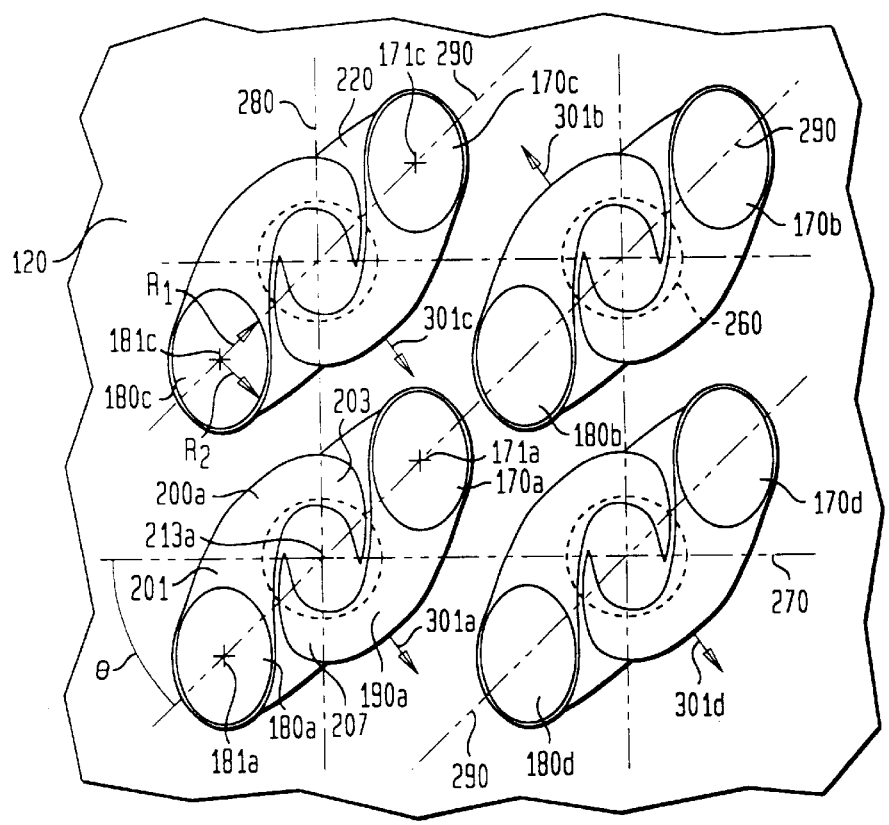
FIG. 2C is a top plan view of the connector shown in FIG. 2A with the aligner sheet removed.

As shown in FIG. 2C, the two posts 170/180 of each post group are positioned on opposite sides of the gap 210 in the post group. The post groups are disposed on the front surface 120 of the supporting substrate 110 in a rectilinear grid pattern so that the gaps defined by the post groups are in mutually orthogonal rows and columns, as shown by lines 270 and 280. The first post 170 and the second post 180 of each group further define an interpost axis extending between central vertical axes 171 and 181 of the posts 170 and 180 of such group, as indicated by lines 290. The interpost axis 290 of each group is oblique to the rows 280 and columns 270 at an angle θ. The angle θ is typically somewhere between 30° and 70° and preferably about 45°. The posts 170/180 may be essentially any size or shape, i.e. triangular, square, round, etc. Preferably, however, the pitch P (center to center spacing as shown in FIG. 1) of the individual sockets matches the pitch of the bump leads on the microelectronic device. The areas of the bottom ends 230 of the posts 170/180 must also be large enough to maintain attachment to the first surface of the substrate 110 when the posts are placed under engagement forces from the bump leads of a microelectronic device to be mated thereto. The forces which may be exerted due to a misaligned bump lead, should also be taken into account when considering the required adherence of the posts 170/180 to the supporting substrate; and thus, the area of the bottom end of each post needed to create a strong bond with the substrate 110. The posts in the embodiment shown in FIG. 2C are generally of uniform cross-sectional shape along their vertical extent, from the bottom end 230 to the top end 240. However, such cross sectional shape is non-circular. The non-circular cross-sectional shapes of the posts are selected so that the radius of the post $R_1$ from the central axis 171 or 181 to the surface of the post along the interpost axis 290 of such group in the direction toward the gap and the other post of the group, is less than the radius of the post $R_2$ from the central axis to the surface in other directions. Thus, the cross-sectional shape may be elliptical, flat or concave along the part of the post surface which faces the respective gap 210. This provides a larger gap than could be accommodated by circular posts of the same area.

As described earlier, contacts 190 and 200, shown best in the top plan view of FIG. 2C, are secured to the top ends 240 of posts 170 and 180. Each contact extends from its associated post generally towards the gap in the associated post group, and towards the other post in the associated post group. Thus, contact 200a extends from post 180a generally towards post 170a of the same group. The contacts 190/200 are typically comprised of a conductive metal which has a spring-like property which allows it to resiliently engage and wipe against bump leads as they are inserted into the gap between an associated post group. Typically, the contacts will be comprised of rolled and annealed copper with a conductive oxide barrier metal plated thereon, such as a layer of gold. However, the contact may be comprised of may other materials, such as nickel, gold, hard gold, titanium and combinations and alloys thereof. Specifically, shape memory alloys, such as nickel-titanium, may be used. Shape memory alloys are in a class of materials known to have super elastic qualities. If a shape memory alloy is used, typically, the contacts will be plated with a highly conductive metal, such as gold, to increase their conductivity. Each contact has a proximal portion extending outwardly from the post and sloping generally away from the interpost axis 290. Thus, proximal portion 201 of each contact 200 slopes away from the interpost axis 290 of the post group. Each contact also has a distal portion 203 extending from the proximal portion and sloping towards the interpost axis. Each contact is generally arcuate. Thus, the proximal portion 201 and distal portion 203 of each contact are both generally arcuate and blend smoothly into one another.

The width or horizontal dimension of the contact transverse to the proximal-to-distal direction of the contact diminishes progressively in the direction towards the distal end of the contact, so that each contact becomes narrower in the direction away from the associated post. Each contact forms a spiral of progressively diminishing radius about the central point 213 of the associated gap. The contacts associated with each post group are intertwined with one another, so that a line drawn from the distal tip of each contact to the central axis of the post associated with such contact, as from tip 203 to central axis 181a would cross over the distal end 207 of the other contact As shown in FIG. 2C, the orientation of the sockets 140 themselves with respect to the other sockets of the same mounting assembly 100 are also preferably optimized to accommodate "fine" pitch bump lead arrays on the order of 0.5 mm or smaller. In order to accommodate such fine pitches, the distance between the adjacent sockets 140 must be minimized while simultaneously: (1) maximizing the gap between the posts of each group so that as large a bump lead as possible may be placed therein; (2) maximizing the area of the bottom end 230 of each of the posts so as to provide sufficient strength to allow for bump lead insertions; and (3) maximizing the size and resiliency of the contacts 190/200 to ensure the contacts may wipe against and resiliently engage inserted bump leads 260, as shown in FIG. 5B. The second post 180 of each group is positioned closer to the first post 170 of the next post group than it is to the first post 170 in its own post group. Thus, second post 180b is disposed at a large distance from first post 170b of the same group, but at a small distance from post 170a of the next post group. This maximizes the gap between the posts of each group. Modern lithographic techniques allow the first posts 170 and second posts 180 of adjacent groups to be spaced apart by only 0.08 mm or less.

In the preferred embodiment shown in FIGS. 2A and 2B, a bump lead aligner sheet 215 is positioned over the top of the socket to align the bump leads with their respective socket contacts 190/200. The aligner sheet 215 is desirably made of a rigid, dielectric material which covers and protects the posts from receiving a lateral force by a misaligned bump lead while still allowing the bump leads to engage the contacts such that the contacts may wipe against and "cradle" the bump lead as it is inserted therein. Non-limiting examples of acceptable aligner 215 materials include ceramic, thick polyimide, FR4 board, or any other material which has the rigidity to withstand the force of a misaligned bump lead. The aligner 215 may sit atop and be supported by the posts 170/180 in each socket 140; however, typically, the aligner 215 is supported by an independent means such as the stand off pins 205. While these pins may be located between each of the individual sockets 140, as shown in FIG. 2A, desirably the aligner is rigid enough to allow the stand off pins to be positioned at the outside corners and/or sides of the connector. FIG. 2B shows a top perspective view of the aligner 215 aligned with the individual sockets using aligner pins 207 and respective alignment holes. If the aligner pins 207 are placed at all four corners of the aligner sheet, the pins may perform the dual function of aligning the sheet 215 to the sockets and providing the desired standoff. In such an embodiment, shoulder pins or there equivalent would desirably be used such that the alignment holes fit over the top portion of the pins and rest atop a lower portion of the pins.

Figure 5A:
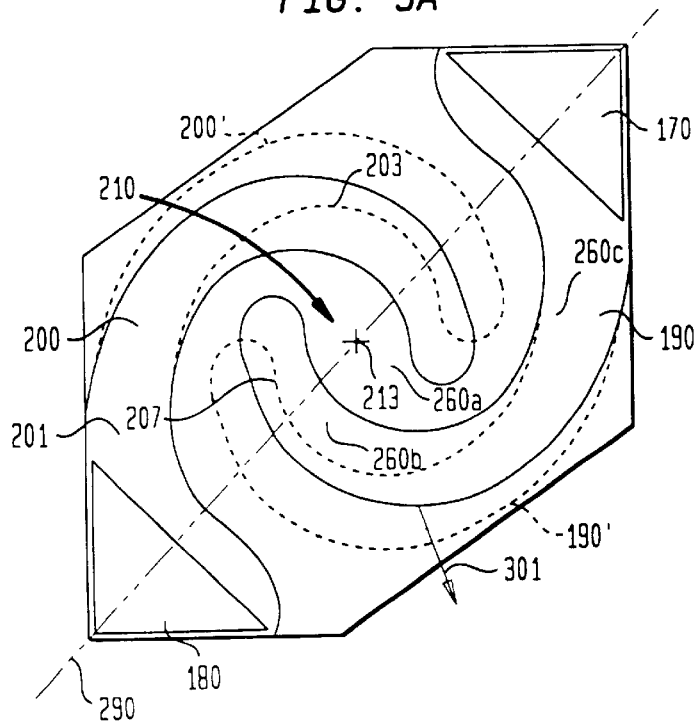
FIG. 5A is a diagrammatic top view of an individual socket with a bump lead superimposed thereover.
Figure 5B:
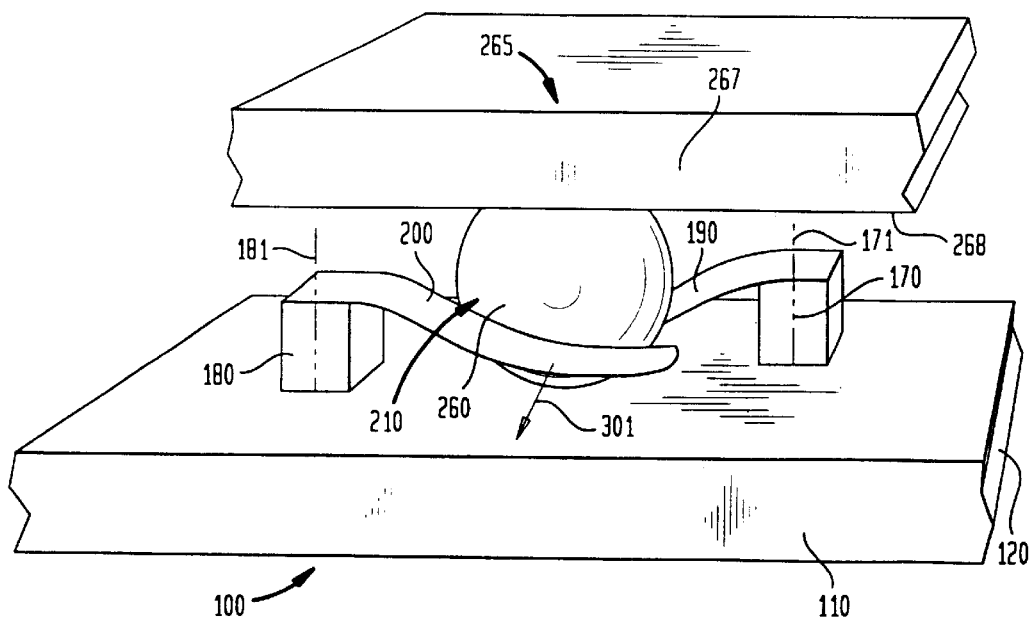
FIG. 5B is a diagrammatic perspective view of a bump lead inserted within a socket in accordance with FIG. 5A.

As shown in FIGS. 5A and 5B, the connector 100 can be engaged with a microelectronic device 265 having a body 267 (FIG. 5B) and a plurality of bump leads 260 on a surface 268. In a method of engagement according to an embodiment of the invention, the lead bearing surface 268 of the microelectronic element is juxtaposed with the front surface 120 of substrate 110. The microelectronic element and substrate are forced towards one another. Each bump lead 260 is aligned with a gap 210 between posts 170 and 180 of a particular post group or socket. Bump leads 260 may be substantially spherical, such as solder balls. As the microelectronic element body 267 and substrate 110 approach one another, the balls penetrate further into gaps 210. At the beginning of this process, a relatively small tip portion 260a (FIG. 5A) of each ball is disposed in the plane of contacts 190 and 200. As the balls penetrate further, a somewhat larger region 260b of the ball reaches the plane of the contacts and the bump lead engages contacts 190 and 200 at their distal tips 203 and 207. As the microelectronic body and bump lead continue their downward motion toward the substrate 110, and as each bump lead penetrates further into the gap 210 of the associated socket, the bump lead engages each individual contact at progressively larger radii from the center 213 of the gap. For example, at some point in the travel of the bump lead, it engages the contact along a circle 260c.

The bump lead tends to force each contact radially outwardly away from the center of gap 213 and tends to bend each contact outwardly away from the center. For example, contact 200 is bent towards the position illustrated in broken lines at 200' whereas contact 190 is swung outwardly towards the position illustrated at 190'. Thus, at least in the later stages of engagement, the bump lead 260 engages the first contact 190 generally along a line of action 301 remote from the central axis 171 of the post 170 associated with contact 190. Similarly, the bump lead engages the second contact 200 along a line of action remote from the central axis 181 of the associated post Thus, engagement between the bump leads and the contacts stresses the posts in torsion about their respective axes. Some of the displacement of contacts 190 and 200 required to accommodate the bump lead may be accomplished by twisting of the post The bump leads themselves also distort Thus, each bump tends to twist downwardly and also to bend outwardly, away from the center 213 of the associated gap. The degree to which the posts 170 and 180 twist depends upon the torsional rigidity of the post, which in turn depends upon the height of the post and the cross-sectional dimensions of the post Likewise, the degree to which the contacts 190 and 200 bend would depend upon the widths, thicknesses and lengths of the contacts. Thus, where the contacts are relatively rigid and the posts are relatively flexible, a substantial amount of the outward movement of the contacts would be due to twisting of the post, whereas, where the contacts are relatively flexible and the posts are more rigid, most of the outward motion would be due to bending of the contacts.

The contacts can accommodate relatively large bump leads and to engage bump leads of different sizes reliably. For example, a bump lead of nominal 12 mil (0.3 mm) diameter, manufactured according to typical industry standards, may have actual diameters between 11 and 13 mils (0.28 and 0.33 mm). Contacts according to this embodiment of the invention can accommodate for a range in bump diameters while still making reliable engagement with the bumps. Moreover, the arrangement of the post groups discussed above provides room for such engagement without sorting between contacts of adjacent sockets.

As best seen in FIG. 5A, each contact bends and swings outwardly, generally along a line of action 301 transverse to the interpost axis 290. The mid-point of each contact, and its line of action 301 is generally aligned with the space between adjacent post groups. For example, line of action 301c is aligned with the space between first post 170a of one group or socket and second post 180b of another group or socket. Line of action 301c is remote from the line of action 301b of the nearest contact 301b moving in the opposite direction. Thus, each contact can bend and swing outwardly through a relatively large distance without touching any element of another socket. Further, as shown in FIG. 5B, the bump lead will typically bottom out on surface 120 and therefore compliance in the vertical (or z) direction is usually not required. The connector may be used to test the bump leads and microelectronic devices, by actuating the device using power or signals transmitted through the engaged bump leads and contacts. If a defect is found, the defective component or components can be disassembled from the connector simply by pulling the component away from the connector so as to disengage the bump leads on the device from the contacts. The contacts can be reused by the next component. If no defect is found, the connector can be used in service without further processing of the connections. The resilient engagement of the contact projections with the bump leads will provide a long-lived electrical connection.

Preferably, however, the bump leads are metallurgically bonded to the contacts after the testing step. This can be done by heating the assembly so as to actuate the bonding material on or comprising the bump leads and thereby form metallurgical bonds between the bump leads and the contacts. There is no need to remove the microelectronic elements or other components from the connector, or to alter the engagement between the bump leads and the contacts between the testing step and the bonding step. Accordingly, there is an extremely high probability that, if the assembly tests acceptably in the testing step, it will continue to be acceptable after the metallurgical bonding step. In operation, the contacts/posts arrangement can deform enough to permit some movement of the bump leads in the x- and y-directions relative to substrate 110. This movement will aid in compensating for the stresses due to thermal expansion.

As described above, the microelectronics device typically has a plurality of such bump leads disposed in a rectilinear grid pattern and each being inserted into the gaps between respective, aligned post groups. In this regard, although the bump leads should be disposed only at the locations defined by such grid, there is no requirement that a bump lead be present at every such post group location. For example, the bump leads may be disposed at every other location or every third location so that the microelectronic device has bump leads on an effective pitch of two, three or some other integral multiple of the pitch of the holes in the connector. As each bump lead penetrates further into the gap, the surface of the bump is scraped and wiped by the inner edge of each contact and by the top surface of each contact. This scraping and wiping action tend to remove oxides and other contaminants from the surface of the bump and provides a reliable connection between the contacts and the bump leads.

In a connector according to a further embodiment of the invention, the contacts 190/200 may also have teeth 340

Figure 3A:
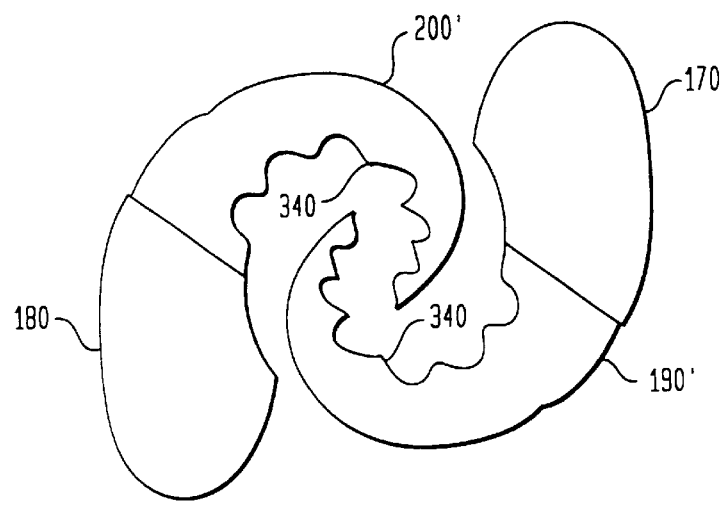
FIG. 3A is a top plan view of an alternate individual socket having teeth-like portions along an interior edge of the contacts, according to a further embodiment of the present invention.
Figure 3B:
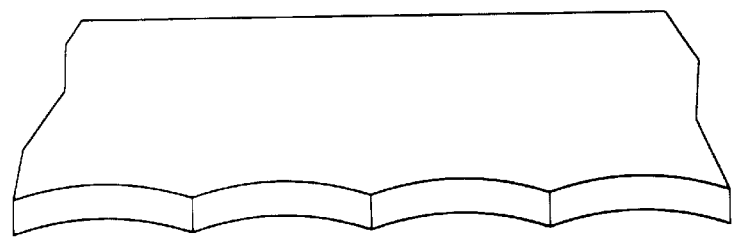
FIG. 3B is a fragmentary perspective view of a portion of the socket shown in FIG. 3A.
Figure 3C:
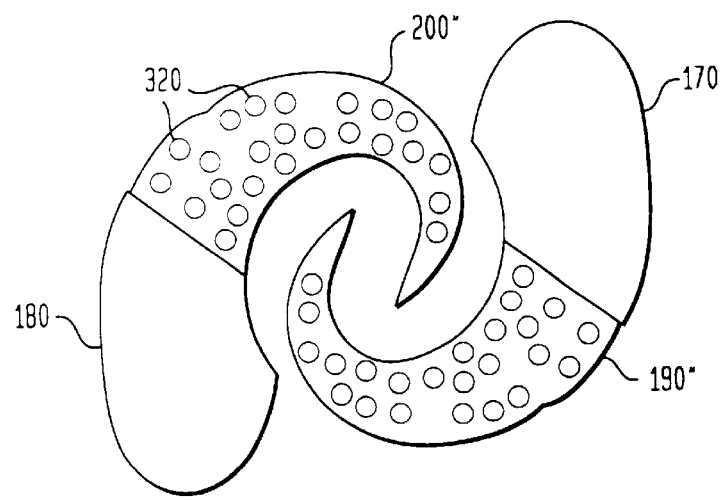
FIG. 3C is a top plan view of an alternate individual socket having asperities on a top surface of the contacts, according to a further embodiment of the present invention.
Figure 3D:
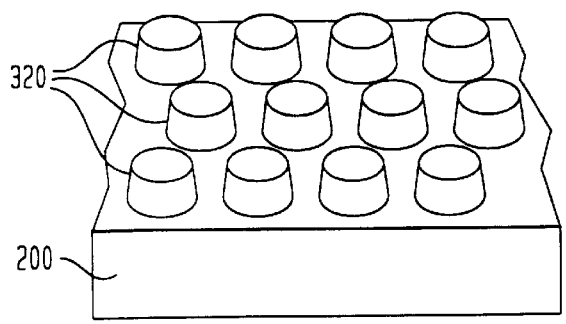
FIG. 3D is a fragmentary perspective view of a portion of the socket shown in FIG. 3C.

(FIGS. 3A and 3B) on an inner edge 330 to engage and scrape against the bump leads inserted therebetween. This provides enhanced wipe to get through the oxide layers which build up on bump leads and make a good electrical contact therewith. These teeth 320 may be created using standard etching techniques during the lithographic process used to form the contacts. FIGS. 3C and 3D show another embodiment having asperities 320 on the top surface of each contact 190"/200". Like the teeth 340, describe above, these asperities 320 will also engage and scrape against the bump leads inserted therebetween providing enhanced wipe to make a good electrical connection therewith. Asperities 320 may be formed by providing dots of an etch-resistant material such as gold or a photoresist on the top surfaces of the contacts and then partially etching the contacts so that material is removed except at the areas covered by such dots. Some combination of features (teeth and asperities together) may further be used to ensure good wipe against the bump leads.

Figure 4A:
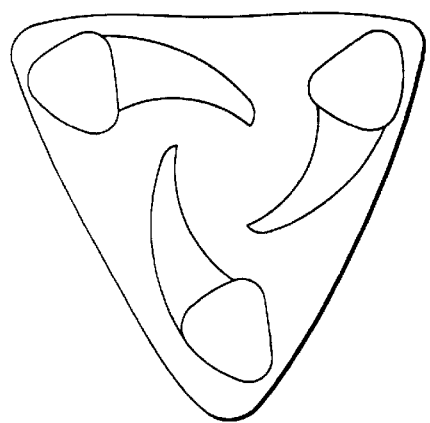
FIG. 4A is a top plan view of an individual socket having three contacts, according to another embodiment of the present invention.
Figure 4B:
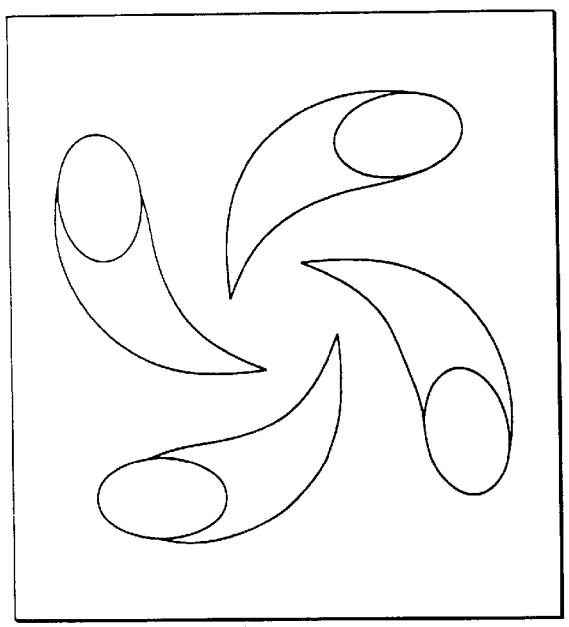
FIG. 4B is a top view of an individual socket having four contacts, according to a further embodiment of the present invention.

FIGS. 4A and 4B show alternate embodiments having multiple contacts with variously shaped posts. FIG. 4A shows a three contact arrangement where each of the contacts extends into the associated gap in such a way that each contact will deflect down and away from the center of the gap when a bump lead is inserted therebetween thereby providing wipe on the inserted bump lead. FIG. 4B shows a four contact embodiment where each of the contacts extends linearly into the associated gap such that the contacts act as leaf springs, wiping the bump lead as it continues to be inserted therebetween. Each of the posts in FIG. 4A is triangular in shape and in FIG. 4B is quadrilateral in shape when viewed from the top. Many different post designs can be used. Each of the posts in FIG. 4A is attached to a contact pad which electrically interconnects the posts for the reasons discussed above. The posts in FIG. 4B are not electrically interconnected to a common contact pad; however, at least one of the posts must be electrically connected to the connection means 160 (shown in FIG. 2A). Teeth or asperities (as shown in FIG. 3) may be added to either of these embodiments to provide for better wipe.

Figure 6A:
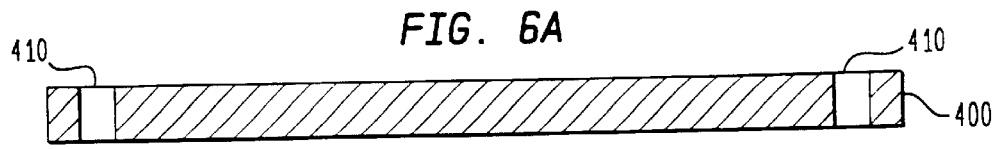
FIGS. 6A–E are diagrammatic sectional views depicting steps in a process for making a connector for a microelectronic device having bump leads, according to a further embodiment of the present invention.
Figure 6B:
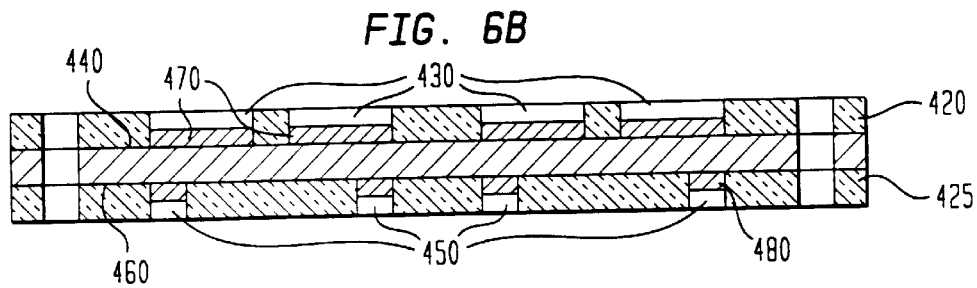

Another aspect of the invention includes a method of fabricating connector for a microelectronic device. An embodiment of this method is shown in FIG. 6. Alignment holes 410 are made in a conductive sheet 400, such as a sheet of rolled and annealed beryllium copper shown in FIG. 6A. Typically, the thickness of the conductive sheet is about 0.3 mil to 1 mil (0.007 mm to 0.025 mm). In FIG. 6B, a dielectric photoresist material 420/425 is then selectively coated onto both sides of the conductive sheet 400 and exposed and developed so as to define contact areas 430 on the top surface 440 of the conductive sheet 400 and post areas 450 on the bottom surface 460 of the conductive sheet 400. To assure accurate registration of the contact areas 430 and post areas 450, the photomasks used to expose resists on opposite sides of sheet 400 are connected to one another in a hinged or pinned fixture.

Figure 6C:
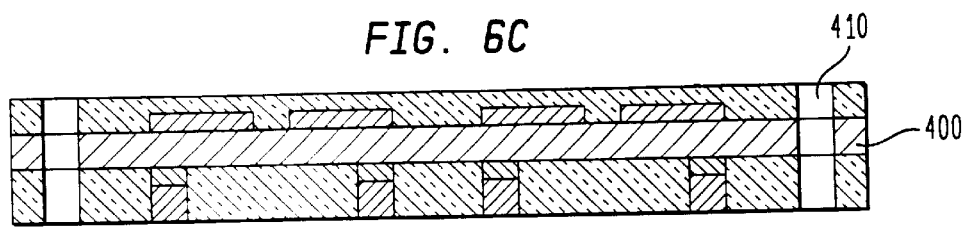

If the contacts and the posts are not comprised of the same material, the dielectric resist on one of the surfaces of the conductive sheet will be first exposed and developed and the corresponding conductive material plated within the defined area on that surface. The plated conductive material will then be covered by a coating of resist and dielectric material on the other surface of the conductive sheet will be exposed and developed and the corresponding conductive material plated therein. For example, a conductive oxide barrier layer (such as a gold layer) may be first plated by aligning the masks and exposing the dielectric 420 to define the contact areas 430. The barrier material is then plated therein. Gold may also plated in corresponding contact areas on the bottom surface of the sheet; although, this step is not required. The barrier layers are then protected by a coating of dielectric resist on the top surface (not shown) and a further dielectric resist 425 on the bottom surface resist is exposed and developed to define the post areas 450. The post material is then plated therein. If required, the height of the posts may be made larger by successively applying new dielectric layers and plating within the newly defined post areas, as shown in FIG. 6C. The posts may also be comprised of several different conductive metals (such as nickel, tin, etc.).

Figure 6D:
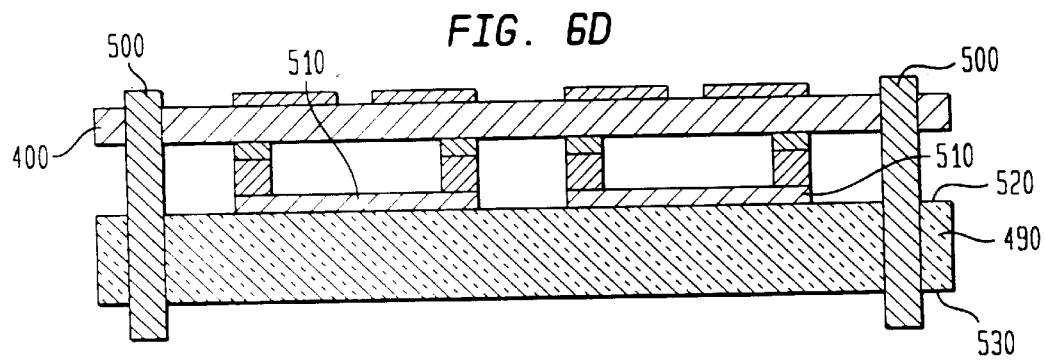

As shown in FIG. 6D, the resists are removed from the conductive sheet and the conductive sheet is joined with a substrate 490 using alignment pins 500. As described above, the supporting substrate is typically made of a rigid, dielectric material. Conductive vias (not shown) are employed, as described above, to electrically connect the sockets to pins or to circuitry on the same substrate 490. The substrate bears conductive pads 510 electrically connected to the vias. All of the post bottoms are simultaneously bonded to the various conductive pads 510. In the preferred embodiment, each post has a thin fin layer plated on its end with another thin layer of gold plated thereon. The conductive pads are comprised of gold so that under heat and pressure a gold-tin eutectic bond is created therebetween. However other suitable post/pad or post/substrate bonding methods may be used and still be within the spirit of the present invention.

Figure 6E:
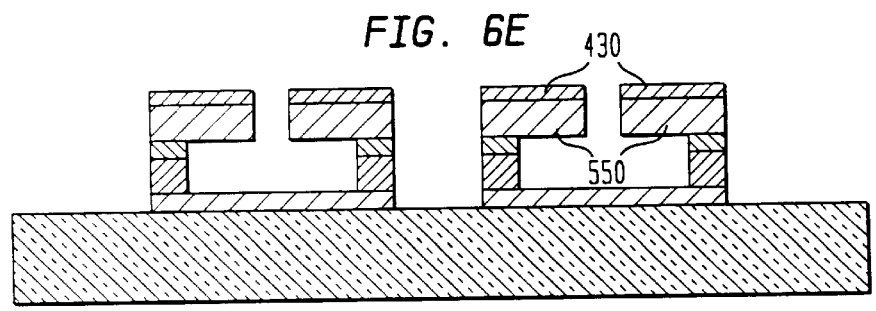

In FIG. 6E, the conductive sheet 400 is then etched to reveal the post and contact structure described above where each contact 550 is generally laminar and has gold oxide-barrier layers 430 thereon. The barrier layers 430 also act as etch resists so that the conductive sheet material 400 is not etched away in the contacts. Because the sheet is not etched to form the contacts until after it is secured to the substrate, the contacts will not be damaged during handling or assembly to the substrate. Moreover, the process forms contacts spaced above the substrate and free to deform in the manner discussed above.

Numerous variations and combinations of the features described above can be employed. For example, in the method discussed above with reference to FIG. 6, the posts can be formed on the substrate, and bonded to the contacts when the sheet is laminated to the substrate. In this arrangement, the bonding material is provided at the top end of each post, remote from the substrate, and bonds to the underside of the sheet.

Having fully described several embodiments of the present invention, it will be apparent to those of ordinary skill in the art that numerous alternatives and equivalents exist which do not depart from the invention set forth above. It is therefore to be understood that the present invention is not to be limited by the foregoing description, but only by the appended claims.

What is claimed is:

1. A method of making connections to a microelectronic device having at least one bump leads thereon, the method comprising the steps of:

providing a substrate having a front surface and a group of electrically conductive posts extending upwardly from the front surface, the posts each having a contact connection end remote from the front surface of said substrate, the posts of said group defining a gap therebetween, each post of said group having a central axis, and a contact having a post connection portion attached to said contact connection end of the posts and a bump lead contact portion extending away from said posts into said gap, said post connection portion of said contact arranged remote from said front surface, arranging said bump lead contact portion of said contact overlying and spaced from the front surface of said substrate within said gap, and assembling the microelectronic device to the substrate and posts so that one of said bump leads penetrates into said gap and engages at least said bump lead contact portion of said contact.

2. The method of claim 1, wherein the substrate includes a plurality of groups of electrically conductive posts, wherein the posts of each group define a gap therebetween and each of the posts of each of the groups has a contact extending from said post into said gap of the posts of each group remote from said front surface.

3. The method of claim 2, wherein each contact is spaced above the front surface.

4. The method as claimed in claim 3, wherein the posts are resilient.

5. The method as claimed in claim 3, wherein each contact extends in a progressively diminishing spiral from a respective post toward a geometric center point with the gap of a respective post group.

6. The method as claimed in claim 3, further comprising a step of forcing each bump lead downwardly between the contacts in a respective post group so that the bump lead forcibly wipes against the contacts.

7. The method as claimed in claim 6, wherein the bump leads are engaged by an interior edge of the contacts, more of the interior edge making contact with the bump leads as the bump lead continues to be inserted within the post group.

8. The method as claimed in claim 6, wherein each contact has teeth-like portions integral with an interior edge and initially facing towards the gap of the respective post group, wherein the bump leads are scraped by the teeth-like portions during the assembling step.

9. The method as claimed in claim 6, wherein each contact has asperities on a surface which initially faces upwardly, toward the microelectronic device, and wherein the bump leads are scraped by the asperities during the assembling step.

10. The method as claimed in claim 3, further comprising a step of bonding the bump leads to the contacts by activating an electrically conductive bonding material at interfaces between the bump leads and the contacts.

11. The method as claimed in claim 10, wherein at least a part of the bonding material is present on the contacts or the bump leads prior to the assembling step.

12. The method as claimed in claim 11, wherein each bump lead includes a solid core and a coating of the bonding, material on the core.

13. The method as claimed in claim 11, wherein the step of activating the bonding material includes a step of momentarily heating the microelectronic device and substrate so as to cause the bonding material to bond at interfaces between the bump leads and the contacts.

14. The method as claimed in claim 10, further comprising a step of electrically testing the assembled microelectronic device and substrate prior to the bonding step by actuating the microelectronic device through the connections between the contacts and the bump leads.

15. The method of claim 3, wherein each group of posts includes two posts.

16. The method of claim 1, wherein said contact extending from said posts is unsupported over said front surface.

17. The method of claim 1, wherein said contact comprises a first contact attached to one of said posts in said group and a second contact attached to another of said posts in said group.

18. The method of claim 17, wherein said first and second contacts each include a post connection portion attached to said contact connection end of an associated post and a bump lead contact portion extending away from an associated post into said gap between said posts, said first and second contacts being arranged spaced above the front surface of said substrate.

19. The method of claim 18, which said bump lead contact portions of said first and second contacts are spaced from each other within said gap.

20. The method of claim 17, wherein said first contact is unattached to said second contact.

21. The method of claim 1, further including arranging each post and its associated contact physically separated from another post and its associated contact within the same group of said posts.

22. A method of making connections to a microelectronic device having at least one bump leads thereon, said method comprising:

providing a substrate having a front surface and a group of electrically conductive posts extending upwardly away from said front surface, each of said posts having a contact connection end spaced above said front surface, said posts defining a gap therebetween extending above said front surface, a first contact attached to one of said posts and a second contact attached to another of said posts, each of said first and second contacts including a post connection portion attached to said contact connection end of an associated post and a bump lead contact portion extending away from said associated post into said gap, arranging said post connection portion and said bump lead contact portion of said first and second contacts spaced above said front surface and spaced from each other to provide a bump lead receiving opening therebetween within said gap, and assembling the microelectronic device to the substrate and posts so that one of said bump leads penetrates into said bump lead receiving opening within said gap and engages at least said bump lead contact portion of said first and second contacts above said first surface.

23. The method of claim 22, wherein said first and second contacts extend in a progressively diminishing spiral from a respective post toward a geometric center point within the gap of said group.

24. The method of claim 22, wherein said group of posts includes two posts.

25. The method of claim 22, wherein said first and second contacts have teeth-like portions integral with an interior edge and initially facing towards the gap of said group, wherein the bump leads are scraped by the teeth-like portions during the assembling step.

26. The method of claim 22, wherein said first and second contacts have asperities on a surface which initially faces upwardly, toward the microelectronic device, and wherein the bump leads are scraped by the asperities during the assembling step.

27. The method of claim 22, further comprising bonding the bump leads to the first and second contacts by activating an electrically conductive bonding material at interfaces between the bump leads and the contacts.

28. The method of claim 27, further comprising electrically testing the assembled microelectronic device and substrate prior to the bonding step by actuating the microelectronic device through the connections between the contacts and the bump leads.

29. The method of claim 22, wherein said first contact is unattached to said second contact.

30. The method of claim 22, further including arranging each post and its associated contact physically separated from another post and its associated contact within the same group of said posts.

* * * * *

UNITED STATES PATENT AND TRADEMARK OFFICE
CERTIFICATE OF CORRECTION

PATENT NO. : 6,286,205 B1
DATED : September 11, 2001
INVENTOR(S) : Anthony B. Faraci, James B. Zaccardi, Thomas H. DiStefano and John W. Smith It is certified that error appears in the above-identified patent and that said Letters Patent is hereby corrected as shown below:

Title page,
Item [75], Inventors: "Distefano" should read -- DiStefano --.

Column 1,
Line 32, "concems" should read -- concerns --.
Line 56, "a" should read -- an --.

Column 2,
Line 17, delete "have" and insert therefor -- has --.
Line 30, "discloses" should read -- disclose --.
Line 49, after "et al." insert -- which --.

Column 3,
Line 23, after "post" insert -- . --.
Line 29, after "that" insert -- it --.
Line 34, "include" should read -- includes --.
Line 45, after "manner" insert -- . --.

Column 6,
Line 51, ""Y"" should read -- "x" --.
Line 52, ""Y"" should read -- "y" --.

Column 7,
Line 32, delete ",".
Line 64, delete "may" and insert therefor -- many --.

Column 8,
Line 58, "FR4" should read -- FR-4 --.

Column 9,
Line 6, delete "there" and insert therefor -- their --.

Column 10,
Line 62, "tend" should read -- tends --.

Column 11,
Line 9, "describe" should read -- described --.
Line 40, after "fabricating" insert -- a --.
Line 66, after "also" insert -- be --.

UNITED STATES PATENT AND TRADEMARK OFFICE
CERTIFICATE OF CORRECTION

PATENT NO.    : 6,286,205 B1
DATED         : September 11, 2001
INVENTOR(S)   : Anthony B. Faraci, James B. Zaccardi, Thomas H. DiStefano and John W. Smith It is certified that error appears in the above-identified patent and that said Letters Patent is hereby corrected as shown below:

Column 12,
Line 19, delete "fin" and insert therefor -- tin --.
Line 52, "leads" should read -- lead --.

Column 13,
Line 27, delete "facing" and insert therefor -- faces --.
Line 42, after "bonding" delete ",".

Column 14,
Line 1, delete "which" and insert therefor -- wherein --.
Line 11, "leads" should read -- lead --.
Line 44, delete "facing" and insert therefor -- face --.
Line 48, "faces" should read -- face --.

Signed and Sealed this

Eighteenth Day of June, 2002

Attest:

JAMES E. ROGAN
Attesting Officer    Director of the United States Patent and Trademark Office